United States Patent
Srinivasan et al.

(10) Patent No.: US 8,551,441 B1
(45) Date of Patent: Oct. 8, 2013

(54) CONTROL OF CRYSTALLOGRAPHIC TEXTURE AND GRAIN SIZE IN BULK THERMOELECTRIC MATERIALS THROUGH CONSTRAINED DEFORMATION

(75) Inventors: Raghavan Srinivasan, Xenia, OH (US); Jonathan E. Spowart, Dayton, OH (US); Nicholas Gothard, Beavercreek, OH (US)

(73) Assignee: United States of America as represented by the Secretary of the Air Force, Washington, DC (US)

(*) Notice: Subject to any disclaimer, the term of this patent is extended or adjusted under 35 U.S.C. 154(b) by 0 days.

(21) Appl. No.: 13/470,170

(22) Filed: May 11, 2012

Related U.S. Application Data

(60) Provisional application No. 61/484,884, filed on May 11, 2011.

(51) Int. Cl.
*C01B 19/04* (2006.01)
*C04B 35/515* (2006.01)
*H01L 21/02* (2006.01)
*H01L 29/02* (2006.01)
*H01L 35/14* (2006.01)
*H01L 35/16* (2006.01)

(52) U.S. Cl.
USPC ............ 423/508; 423/509; 264/104; 438/795; 438/797; 252/62.3 T; 136/239; 136/240

(58) Field of Classification Search
USPC ................ 423/508, 509; 264/104; 438/795, 438/797; 252/62.3 T; 136/239, 240
See application file for complete search history.

(56) References Cited

U.S. PATENT DOCUMENTS

| | | | | |
|---|---|---|---|---|
| 3,059,040 | A * | 10/1962 | Horst et al. | 252/62.3 T |
| 3,086,068 | A * | 4/1963 | Charland et al. | 419/48 |
| 3,475,116 | A * | 10/1969 | Carnall, Jr. et al. | 423/509 |
| 6,274,802 | B1 * | 8/2001 | Fukuda et al. | 136/201 |
| 6,617,504 | B2 * | 9/2003 | Kajihara et al. | 136/201 |
| 2002/0059950 | A1 * | 5/2002 | Lee et al. | 136/201 |
| 2010/0236596 | A1 * | 9/2010 | Lee et al. | 136/230 |

* cited by examiner

*Primary Examiner* — Timothy Vanoy
(74) *Attorney, Agent, or Firm* — AFMCLO/JAZ; Fredric Sinder

(57) ABSTRACT

New methods for improving thermoelectric properties of bismuth telluride based materials are described. Constrained deformation, such as by canned/sandwich, or encapsulated, rolling and plane strain channel die compression, particularly at temperatures above 80% of the melting point of the material on an absolute temperature scale, changes the crystallographic texture and grain size to desirably increase the values of both the thermoelectric power factor and the thermoelectric figure of merit ZT for the material.

9 Claims, 5 Drawing Sheets

US 8,551,441 B1

CONTROL OF CRYSTALLOGRAPHIC TEXTURE AND GRAIN SIZE IN BULK THERMOELECTRIC MATERIALS THROUGH CONSTRAINED DEFORMATION

CROSS REFERENCE TO RELATED PATENT APPLICATIONS

This application claims priority under 35 U.S.C. §119(e) from U.S. provisional application 61/484,884, filed May 11, 2011 and titled "Control of Crystallographic Texture and Grain Size in Bulk Thermoelectric Materials Through Constrained Deformation." The invention description contained in that provisional application is incorporated by reference into this description.

RIGHTS OF THE GOVERNMENT

The invention described herein may be manufactured and used by or for the Government of the United States for all governmental purposes without the payment of any royalty.

BACKGROUND OF THE INVENTION

The present invention relates generally to methods for improving thermoelectric properties of thermoelectric materials by controlling crystallographic texture and grain size, and particularly to constrained deformation of bismuth telluride based materials by processes such as canned/sandwich rolling, plane strain rolling and plane strain channel die compression at temperatures in excess of 80% of the melting point.

The thermoelectric (TE) effect is the phenomenon of conversion of a temperature difference to an electrical voltage, the Seebeck effect, and an electrical voltage to a temperature difference, the Peltier effect. The Seebeck effect was first observed in the 1820s at junctions between dissimilar metals. The ability of a material to convert temperature differences to electrical voltage, measured by the Seebeck coefficient $S=\Delta V/\Delta T$ (also called thermopower or thermoelectric power), has been exploited in temperature measuring devices, such as thermocouples. However, in order to use this phenomenon for efficient energy conversion between thermal and electrical energy at any temperature T, the property that needs to be maximized is the thermoelectric figure of merit $ZT=S^2T(\sigma/\kappa)$, where $\kappa$ is electrical conductivity, $\kappa$ thermal conductivity, S is the Seebeck coefficient (or thermopower), and T is the temperature.

An efficient thermoelectric material must, therefore, exhibit a combination of high S (typical of semi-conductors), high $\sigma$ (typical of metals) and a low $\kappa$ (typical of insulators). This combination of properties is difficult to achieve.

Thermoelectric materials of interest are generally semi-conductors or ceramics with limited ductility. As such, they are difficult to process into the net shapes required for application as energy harvesting devices or thermoelectric coolers (Peltier coolers) for solid-state refrigeration applications. However, these materials can be deformation processed at elevated temperatures to form bulk solids. Prior art deformation processes include hot or cold pressing of powders followed by extrusion into billets for final machining to component geometries. The electronic and thermal properties of these extruded materials are anisotropic due to the crystallographic texture imparted during deformation processing, and they are usually mechanically brittle, depending on chemistry and composition. Typically, prior art deformation processing paths are not tailored to optimize both thermoelectric and mechanical properties.

In a temperature range from −20° C. to about 150° C., which is relevant for most heating and refrigeration applications, bismuth telluride ($Be_2Te_3$ or bismuth telluride) has the highest figure of merit among currently available bulk thermoelectric (TE) materials. However, solid state refrigeration systems using the thermoelectric phenomenon have energy efficiencies less than 10% and are therefore used only in niche applications.

There is, therefore, a need for new and improved methods for improving thermoelectric properties of thermoelectric materials.

SUMMARY OF THE INVENTION

The present invention provides new methods for improving the thermoelectric properties of bulk bismuth telluride based materials, as well as other materials having similar structures, through control of crystallographic texture and grain size. In particular, bismuth telluride is subject to constrained deformation by processes such as, but not limited to, plane strain rolling, canned/sandwich rolling, and plane strain channel die compression at temperatures in excess of 80% of the material melting point on an absolute temperature scale (such as Kelvin) to produce a structure with a layered fine grain morphology and a highly oriented crystallographic structure, in which the most favorable crystallographic directions are oriented in a manner that will produce improved thermoelectric properties.

The current invention, which uses a plane strain deformation approach allows for the creation of large volumes of material with a consistent and favorable crystallographic orientation. The process can potentially be scaled up to large production sizes.

BRIEF DESCRIPTION OF THE DRAWINGS

The teachings of the present invention will be better understood from the following drawings illustrating various aspects and example embodiments of the invention and its teachings.

DETAILED DESCRIPTION

Constrained deformation methods for improving thermoelectric properties of bismuth telluride and similar materials work better than prior art approaches. The prior art is primarily hot extrusion, resulting in rods in which the "c" axis, described later in more detail, is intended to be oriented in a radial direction. Thermoelectric elements extracted from extruded stock are limited in size because the "c" axis is parallel only over a small region. A constrained deformation rocess where deformation of a workpiece material is restricted in one direction, while a force is applied in a perpendicular direction, as described later using encapsulated or sandwich rolling, results in a flat plate. A large volume of the plate will have the "c" axis oriented er endicular to the rollin lane. This makes it possible to extract thermoelectric elements much larger than are possible from extruded rods.

Prior work by Chen et al., Yang et al. and Vasilevskiy et al. shows that hot extrusion creates crystallographically aligned microstructures in bismuth telluride. The limitations of extrusion include an alignment direction perpendicular to the extrusion direction and a variation in alignment with position. As stated, the size of the thermoelectric elements that can be produced from extruded stock is severely limited.

"Hot" constrained deformation appears to improve the success of the process based on a hypothesis that at elevated temperatures above about 80% of the melting point on an absolute temperature scale, the van der Waals interactions in the bismuth telluride structure are sufficiently weakened, leaving essentially a planar structure comprising 5-layer stacks of alternating tellurium and bismuth. This structure is analogous to sheets of glass held together with a fluid film. During deformation at these temperatures, the basal slip will be the primary deformation mechanism. The layers can freely slide or rotate to an orientation perpendicular to the predominant compression direction. Further, grain fragmentation, as well as dynamic recrystallization at these temperatures, and any static recrystallization that occurs will advantageously contribute to grain refinement.

The goal is to create large volumes of thermoelectric material which consist of fine grains, all having their "c" axis oriented parallel to each other, while the "a" axis is randomly oriented in a perpendicular plane. The described constrained deformation process at elevated temperature allows such a material to be manufactured.

Figure 1:
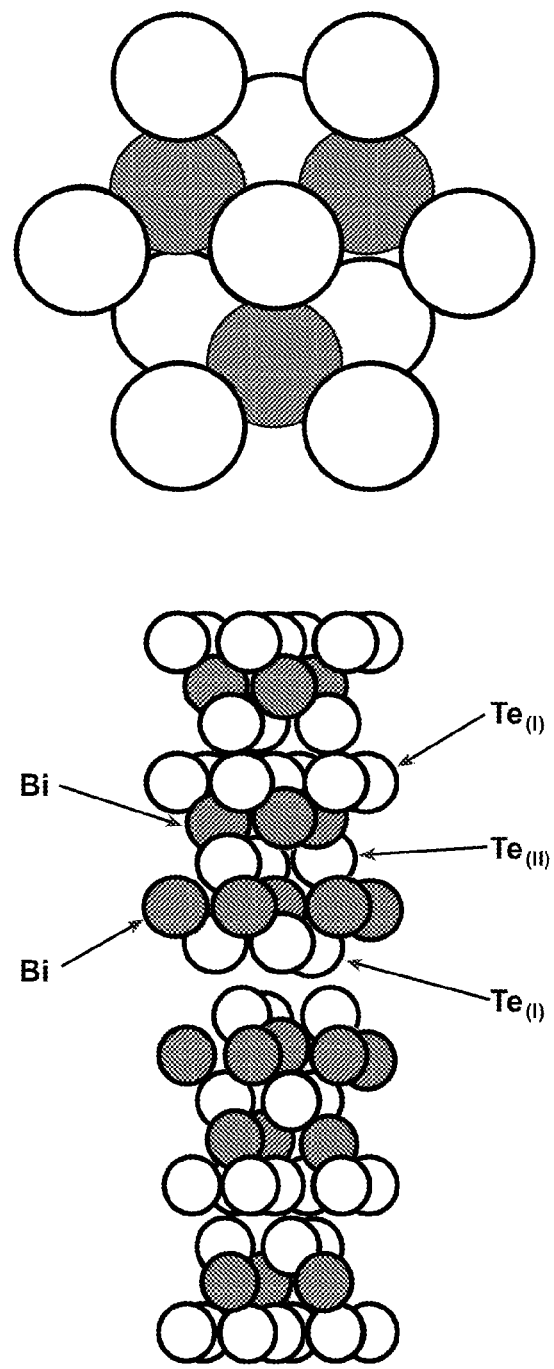
FIG. 1 shows the structure of single crystal bismuth telluride.

Bismuth telluride has a trigonal crystal structure comprising stacked layers of Bi and Te atoms in the following sequence: {Te(I)—Bi—Te(II)—Bi—Te(I)}n. The structure shown in FIG. 1 has lattice constants of a=0.438 nm and c=3.503 nm. The crystal structure can be treated as a variation of a hexagonal lattice and Miller-Bravais notation used to describe the planes and directions. The bonds among Bi atoms and Te atoms are strong primary (covalent or covalent-ionic) bonds, while those between adjacent $Ti_{(I)}$ layers are weaker secondary bonds from van der Waals interactions. Electron conducting or n-type bismuth telluride is doped with selenium whose atoms replace tellurium atoms in the lattice. The high figure of merit at room temperature for n-type bismuth telluride (ZT≈1) is attributed to a large thermopower value (S≈200 µV/° K), high electrical conductivity ($\sigma$=1000 $\Omega^{-1}$ cm$^{-1}$) and low thermal conductivity ($\kappa$=1.5 W/m/° K). The thermal conductivity of bulk bismuth telluride is unusually low. Using estimations of the lattice thermal conductivity and ultrasound attenuation, Peranio and Eibl, in a 2009 paper, attributed a low value of thermal conductivity to phonon scattering by dislocations in the basal plane.

The structure of bismuth telluride is anisotropic with respect to electrical and thermal transport properties, that is, $(\sigma_{11}/\sigma_{33})\approx 4$, $(\kappa_{11}/\kappa_{33})\approx 2$, but almost isotropic with respect to thermopower, that is, $S_{11} \approx S_{33}$ where the (11) direction is in the basal plane and the (33) direction is the "c" direction and perpendicular to the basal plane. This means that $Z_{11}$ is about twice $Z_{33}$.

The electrical conductivity $\sigma$ of semiconductors is a function of electron (n-type semiconductor) or hole (p-type semiconductor) concentration. The thermal conductivity has both electron and phonon components; ($\kappa = \kappa_e + \kappa_L$). Generally speaking, the electronic component $\kappa_e$, which can be derived from electrical conductivity through the Wiedeman-Franz law, $\kappa_e = L\sigma T$, where the Lorenz factor, L, increases with the electrical conductivity $\sigma$. However, the phonon or lattice component $\kappa_L$ depends on the defects present in a solid. In bulk semiconductors, such as bismuth telluride, $\kappa_L$ is larger than $\kappa_e$. Therefore, if $\kappa_L$ is decreased by structural modification, the overall thermal conductivity, and therefore the figure of merit, can be increased, since this change can be made without significantly affecting $\sigma$ and $\kappa_e$. Approaches for decreasing the phonon (lattice) component of thermal conductivity include methods for increasing the number of phonon scattering sites, such as substitutional solute atoms (doping), "rattler" atoms (for example, in skutterudites), and interfaces introduced by decreasing the size and/or dimensionality of the thermoelectric material, such as by using thin films (2-dimensions), wires (1-dimension), or by decreasing grain size in bulk materials (nano-structures).

Thermal conductivity in nonmetallic systems such as bismuth telluride is primarily by phonons, which have mean-free-paths in the range of 1 to 100 nm. At low temperatures, phonon scattering occurs on crystal surfaces, grain boundaries, and on the strain field of dislocations, with significant impact on lattice thermal conductivity. Reducing the scale of the microstructure to the scale of the phonon mean-free-path should, therefore, increase the level of interactions of phonon with structural features, thereby reducing thermal conductivity.

From these teachings, one can infer a potential to increase the thermoelectric figure of merit ZT in a bulk thermoelectric material, such as bismuth telluride, by modifying the microstructure. The bulk material should have a structure comprising ultra-fine grains (sub-micron to nano size) having a high degree of crystallographic orientation, where the "c" direction of all the grains are aligned and the basal planes all parallel but with misorientation of the basal planes between grains by rotation about the "c" axis. A bulk solid with such a crystallographically oriented fine grain structure will, therefore, take advantage of the inherent anisotropy of properties of bismuth telluride, as well as the phonon scattering resulting both from grain boundary scattering and from dislocations at the grain boundaries and in the interior of grains. A concomitant improvement in the figure of merit ZT can be expected. Furthermore, if such a material is produced by deformation processing, the presence of residual dislocations in the structure will provide additional scattering sites for phonons.

Bismuth telluride based alloys have been a subject of research for several decades. During this period, thermomechanical processing has been investigated primarily as a means for obtaining bulk polycrystalline material, as an alternative to single crystals which tend to be very brittle. A variety of methods have been used to process bismuth telluride based materials, including "pulverizing and intermixed elements sintering" (PIES), mechanical alloying (MA), hot extrusion (HE) and equal channel angular extrusion (ECAE). Surprisingly, there has been no systematic study of the flow behavior and of microstructure and texture development during hot deformation. A few of the studies that have been reported in literature are discussed in the following paragraphs.

As described, bismuth telluride has a trigonal crystal structure (space group R$\bar{3}$m), which can be viewed as a variation of a hexagonal system. A unit cell has a large c/a ratio of 6.96, as a result of which only basal slip can be expected during plastic deformation. The repeating five-atomic layer stack consists of alternating layers of covalently bonded Te and Bi, with secondary bonds (van der Waals interactions) every fifth layer between adjacent Te layers. At room temperature, a bismuth telluride single crystal is brittle and cleaves easily on the basal plane. The microstructure of polycrystalline bismuth telluride varies between a layered structure, similar to mica, and a granular structure, similar to sandstone.

Bismuth telluride based alloys have been successfully hot deformed at temperatures in the range of 400 to 500° C. by extrusion, both conventional and ECAE, and powder compacts have been sintered at temperatures as low as 400° C. The melting point of undoped bismuth telluride is 585° C. (858° K), making these processing temperatures between 0.78 and 0.9 of the material melting point temperature ($T_{mp}$). It can be expected that at these temperatures, bismuth telluride powder compacts will sinter, solids will undergo creep deformation, and grain growth will occur in polycrystalline materials.

Sokolov et al., in a 1996 paper, using an indirect approach, obtained the strain rate sensitivity for both n- and p-type bismuth telluride in the temperature range of 400-500° C. Using hot extrusion, under conditions of constant ram speed and constant pressure, they showed that the strain rate sensitivity of bismuth telluride may be as high as 0.8 at strain rates less than $10^{-2}$ $s^{-1}$ and decreases to less than 0.2 at strain rates of 1 $s^{-1}$. These strain rate sensitivity values indicate that the material may even behave in a superplastic manner.

In a study on the effect of extrusion on texture development, Vasilevskiy et al., in a 2002 paper, reported that after extrusion there is an alignment of the "c" axis perpendicular to the extrusion direction. However, there is a decrease in the texture from the surface to the center of the extruded bar. They attribute these observations to the stresses exerted by the die on the along the outer surface of the work-piece, which cause an alignment of the basal plane with the extrusion direction. However, towards the center of the bar, the die effect is diminished, resulting in less alignment. Chen et al., in a 2009 paper, measured development of texture using electron backscatter diffraction (EBSD) analysis, and report that with increasing strain, the basal plane gradually rotates to a direction parallel to the extrusion axis, and a "ring-like" fiber texture with the "c" axis oriented perpendicular to the extrusion axis is formed.

Yang et al. reported in 2006 that very little information was available on the plastic flow behavior of bismuth telluride, and they had to assume a stress/strain/strain-rate relationship to be able to conduct finite element simulations of the extrusion process. Using predicted strain distributions from their FE analysis and experimental X-ray texture analysis, they were able to show a strong dependence of the imposed strain on the texture developed during extrusion.

Despite extensive work in the prior art, deformation processing techniques such as hot rolling, channel-die compression and forging, which can impart very much higher levels of crystallographic texture in a controlled manner, have not been successfully attempted on these thermoelectric materials.

The present invention demonstrates that a processing route can be tailored to optimize the thermoelectric power-factor and figure of merit. Example embodiments of this approach have been demonstrated using bismuth telluride as a model material, and hot rolling as a model deformation process. Other deformation processes, such as channel die compression, extrusion, high pressure torsion and forging, may also be used with bismuth telluride and with other materials.

A few example embodiments of using constrained deformation according to the teachings of the present are described in the following paragraphs.

Figure 2:
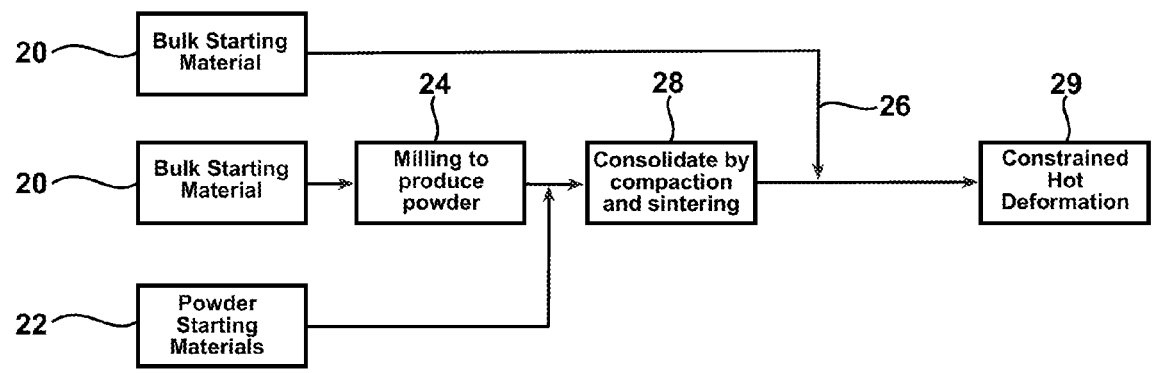
FIG. 2 is a simplified flow chart of an example embodiment of material preparation and processing of a thermoelectric material according to the teachings of the present invention.

FIG. 2 is a simplified flow chart of an example embodiment of material preparation and processing of a thermoelectric material according to the teachings of the present invention.

A starting workpiece material is obtained either in bulk form 20, such as an extruded rod, or in powder form 22, either obtained as powder or by mechanical milling 24 of bulk form 20.

A bulk workpiece material 20 may also be used in an as-received condition 26.

The powder workpiece material may be consolidated by compaction and sintering at temperatures greater than 0.5 of the material melting point (on an absolute temperature scale, usually Kelvin) to produce powder compacts.

The thus prepared workpiece is then processed by constrained hot deformation 29 as described in the following paragraphs of example constrained hot deformation.

Figure 3A:
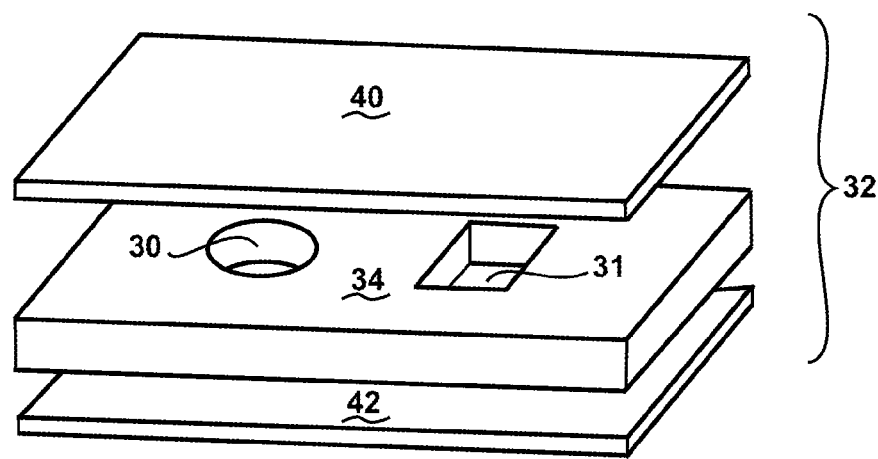
FIGS. 3a and 3b are example embodiments of a canned/sandwich assembly for constrained deformation of a thermoelectric material according to the teachings of the present invention.
Figure 3B:
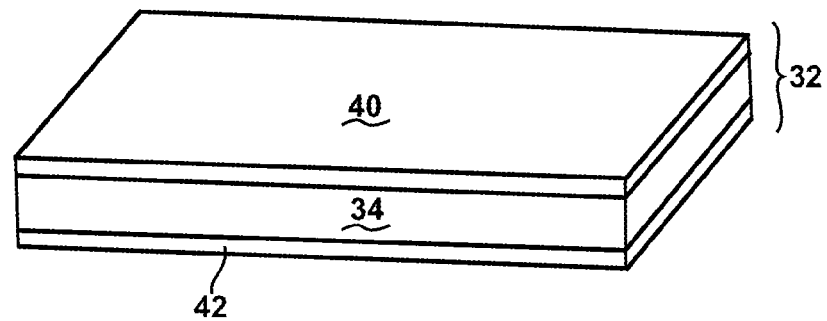

FIGS. 3a and 3b are example embodiments of a canned/sandwich assembly 32 for constrained deformation of a thermoelectric material according to the teachings of the present invention.

A deformation constraining enclosure (can/sandwich) 32 comprises a middle plate 34 with machined cavities 30 and 31 for insertion of material prepared as described earlier, and includes a top plate 40 and a bottom plate 42. The prepared material is inserted into middle plate 34 and top and bottom plates 40 and 42 welded to middle plate 34 to create canned/sandwich rolling assembly 32.

Top, middle and bottom plates 40, 34 and 42 are made of a material, such as a ferrous material or an aluminum alloy that does not react with the workpiece material.

A lubricating coating or a parting agent may be used to coat the cavities and the plates to ensure easy removal of the workpiece material after processing.

The assembly may be evacuated of air prior to final sealing of the deformation constraining enclosure.

The canned/sandwich assembly is heated in a furnace for at least 30 minutes to ensure uniform temperature, and the temperature of the furnace is at least 0.8 of the melting point of the workpiece material on an absolute temperature scale.

The canned/sandwich assembly is then deformed by rolling in multiple passes. Deformation increments of 10% of the initial thickness of the canned/sandwich rolling assembly per pass may be used.

The canned/sandwich rolling assembly is then returned to the furnace for 3 to 5 minutes between rolling passes.

A total deformation of 50% reduction in thickness of the canned/sandwich rolling assembly is achieved after 5 passes.

Figure 4A:
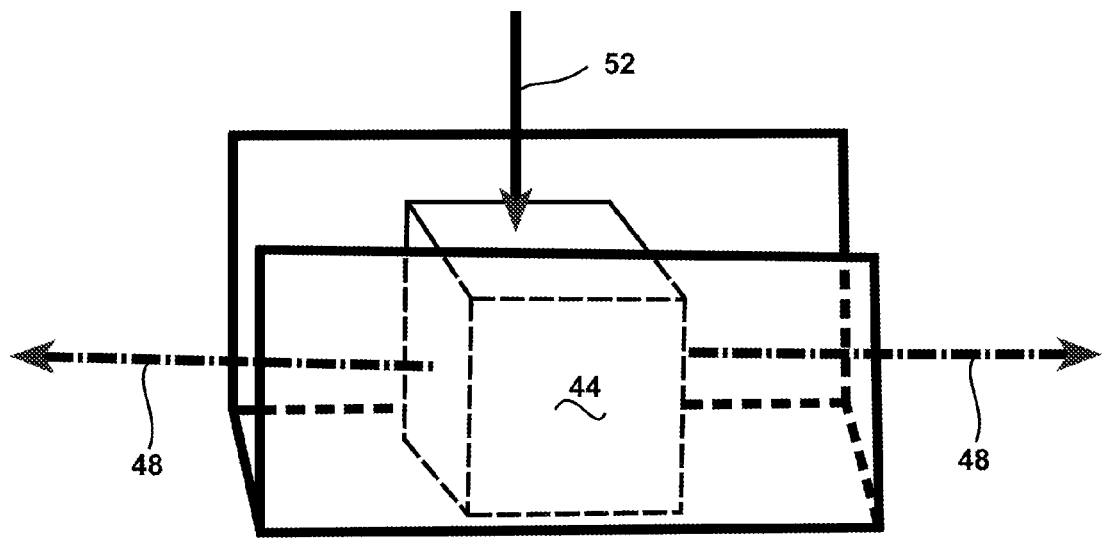
FIGS. 4a and 4b are example embodiments of a plane strain compression assembly for constrained deformation of a thermoelectric material according to the teachings of the present invention.
Figure 4B:
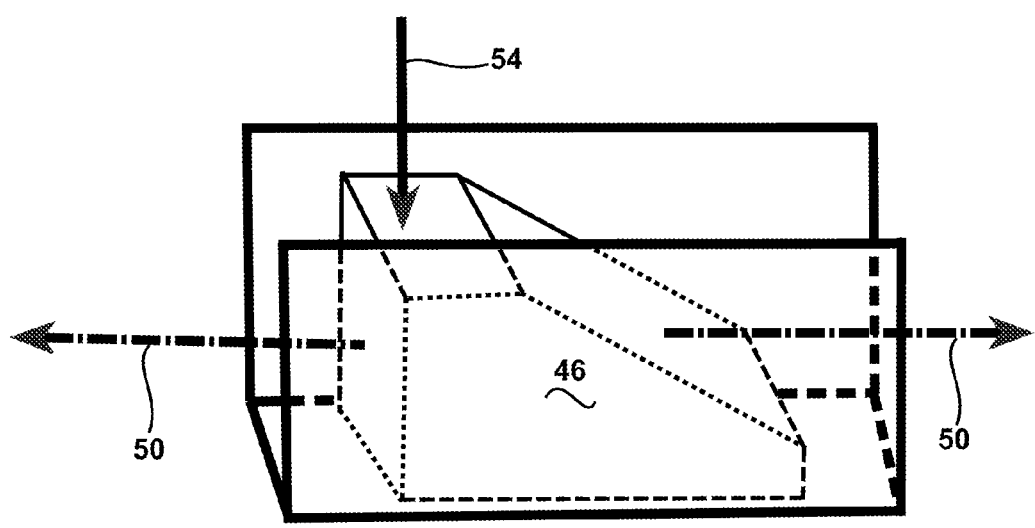

FIGS. 4a and 4b are example embodiments of a plane strain compression assembly for constrained deformation of a thermoelectric material according to the teachings of the present invention.

A workpiece material 44 or 46 prepared as previously described is sectioned to the appropriate shape prior to plane strain compression. During plane strain compression, deformation of workpiece material 44 or 46 is restricted to along one direction, 48 and 50, while a force 52 and 54 is applied in a perpendicular direction.

Workpiece material 44 or 46 is placed in the plane strain compression device and heated up to a deformation temperature at least 0.8 of the melting point of the workpiece material on an absolute temperature scale.

Vacuum or inert atmosphere may be used to avoid exposure of the workpiece material to oxidizing atmospheres at elevated temperatures.

Total deformation is obtained through a continuous application of force.

Figure 5:
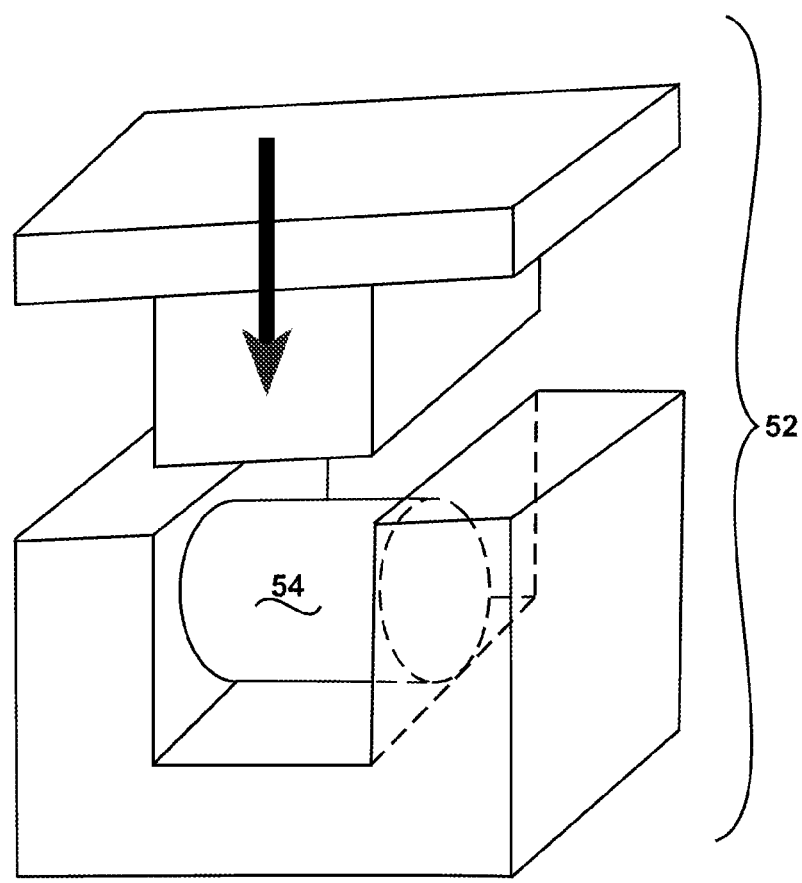
FIG. 5 is an example embodiment of a channel die compression assembly for constrained deformation of a thermoelectric material according to the teachings of the present invention.

FIG. 5 shows another approach for plane strain compression, using a channel die compression assembly 52 for constrained deformation of a thermoelectric material disk 54 according to the teachings of the present invention.

The described example embodiments can applied to sintered powder or cast pieces, or to any other starting form.

Various modifications to the invention as described may be made, as might occur to one with skill in the art of the invention, within the scope of the claims. Therefore, all contemplated example embodiments have not been shown in complete detail. Other embodiments may be developed without departing from the spirit of the invention or from the scope of the claims.

We claim:

1. A method for thermomechanical processing of a thermoelectric material, comprising the step of subjecting the thermoelectric material to constrained deformation.

2. The method for thermomechanical processing of a thermoelectric material according to claim 1, wherein the thermoelectric material is bismuth telluride based.

3. The method for thermomechanical processing of a thermoelectric material according to claim 1, wherein the constrained deformation is performed at temperatures above about 80% of the material melting point on an absolute temperature scale.

4. The method for thermomechanical processing of a thermoelectric material according to claim 2, wherein the constrained deformation is performed at temperatures above about 80% of the material melting point on an absolute temperature scale.

5. A bulk thermoelectric material prepared by a process comprising the step of subjecting the thermoelectric material to constrained deformation.

6. The bulk thermoelectric material according to claim 5, wherein the thermoelectric material is bismuth telluride based.

7. The bulk thermoelectric material according to claim 5, wherein the constrained deformation is performed at temperatures above about 80% of the material melting point on an absolute temperature scale.

8. The bulk thermoelectric material according to claim 6, wherein the constrained deformation is performed at temperatures above about 80% of the material melting point on an absolute temperature scale.

9. A method for thermomechanical processing of bismuth telluride based materials, comprising the step of subjecting the bismuth telluride based material to constrained deformation.

* * * * *